(12) United States Patent
Shiraki et al.

(10) Patent No.: US 7,755,187 B2
(45) Date of Patent: Jul. 13, 2010

(54) LOAD DRIVING DEVICE

(75) Inventors: Satoshi Shiraki, Toyohashi (JP); Akira Yamada, Nukata-gun (JP); Hiroyuki Ban, Hazu-gun (JP)

(73) Assignee: DENSO CORPORATION, Kariya (JP)

( * ) Notice: Subject to any disclaimer, the term of this patent is extended or adjusted under 35 U.S.C. 154(b) by 414 days.

(21) Appl. No.: 11/806,467

(22) Filed: May 31, 2007

(65) Prior Publication Data

US 2008/0007920 A1    Jan. 10, 2008

(30) Foreign Application Priority Data

Jun. 5, 2006   (JP)   ............... 2006-156686
Apr. 25, 2007  (JP)   ............... 2007-116133

(51) Int. Cl.
  *H01L 23/34*   (2006.01)
  *H01L 23/495*  (2006.01)
(52) U.S. Cl. .............. 257/723; 257/666; 257/707; 257/713; 257/E23.051
(58) Field of Classification Search .......... 257/723, 257/666, 707, 713, 691, 690, 501, E23.051
See application file for complete search history.

(56) References Cited

U.S. PATENT DOCUMENTS

| | | | |
|---|---|---|---|
| 5,396,403 A * | 3/1995 | Patel | 361/705 |
| 5,608,610 A * | 3/1997 | Brzezinski | 361/704 |
| 6,130,458 A * | 10/2000 | Takagi et al. | 257/351 |
| 6,529,062 B2 | 3/2003 | Majumdar et al. | |
| 6,661,659 B2 * | 12/2003 | Tamba et al. | 361/699 |
| 6,680,545 B2 * | 1/2004 | Young et al. | 257/787 |
| 6,703,707 B1 * | 3/2004 | Mamitsu et al. | 257/718 |
| 7,091,597 B2 | 8/2006 | Masui | |
| 7,535,092 B2 * | 5/2009 | Yokozuka | 257/688 |
| 2002/0036355 A1 * | 3/2002 | Young et al. | 257/787 |
| 2005/0167821 A1 * | 8/2005 | Mamitsu et al. | 257/718 |
| 2006/0071860 A1 * | 4/2006 | Hozoji et al. | 343/700 MS |
| 2006/0086449 A1 | 4/2006 | Nakayama | |
| 2006/0097407 A1 | 5/2006 | Ito | |

FOREIGN PATENT DOCUMENTS

| | | |
|---|---|---|
| JP | A-2003-068959 | 3/2003 |
| JP | A-2005-000419 | 1/2005 |
| JP | A-2005-056873 | 3/2005 |
| JP | A-2005-175130 | 6/2005 |

* cited by examiner

*Primary Examiner*—Nitin Parekh
(74) *Attorney, Agent, or Firm*—Posz Law Group, PLC

(57) ABSTRACT

A load driving device includes: an output power device for driving a load; a driving IC for controlling the output power device, wherein the driving IC is electrically coupled with the output power device through a wire or a connection member; and a first electrode substrate. The output power device and the driving IC are mounted on the first electrode substrate. In this case, the output power device is controlled with high speed, and a mounting area of the output power device and the driving IC is reduced.

9 Claims, 10 Drawing Sheets

LOAD DRIVING DEVICE

CROSS REFERENCE TO RELATED APPLICATIONS

This application is based on Japanese Patent Applications No. 2006-156686 filed on Jun. 5, 2006, and No. 2007-116133 filed on Apr. 25, 2007, the disclosures of which are incorporated herein by reference.

FIELD OF THE INVENTION

The present invention relates to a load driving device.

BACKGROUND OF THE INVENTION

A load driving device is shown in, for example, JP-A-2005-175130. The device includes an inverter, a signal generator and a control circuit. The signal generator receives a signal from the control circuit and generates a PWM (i.e., pulse width modulation) signal, which provides to turn on and off an output power device of the inverter. The inverter includes the output power device such as an IGBT, a driving IC for receiving the PWM signal from the signal generator and for operating to switch on and off the output power device, and a reverse parallel connection diode for flowing current from an emitter to a collector in the output power device. The output power device and the reverse parallel connection diode are sandwiched between two electrode plates.

In the above load driving device, the output power device and the reverse parallel connection diode are mounted on the same electrode plate. However, there is no disclosure in JP-A-2005-175130 that the driving IC is also mounted on the same electrode plate.

Accordingly, a wiring distance for electrically connecting between the output power device and the driving IC may become longer. Thus, a control speed of the output power device is reduced. Further, the output power device is provided by a body different from the driving IC, i.e., the output power device is an independent body from the driving IC. Thus, a mounting area becomes larger.

Thus, it is required for the load driving device to minimize the dimensions of the device and to improve the control speed.

SUMMARY OF THE INVENTION

In view of the above-described problem, it is an object of the present disclosure to provide a load driving device.

According to a first aspect of the present disclosure, a load driving device includes: an output power device for driving a load; a driving IC for controlling the output power device, wherein the driving IC is electrically coupled with the output power device through a wire or a connection member; and a first electrode substrate. The output power device and the driving IC are mounted on the first electrode substrate. In this case, the output power device is controlled with high speed, and a mounting area of the output power device and the driving IC is reduced.

According to a second aspect of the present disclosure, a load driving device includes: an output power device for driving a load; a driving IC for driving the output power device, wherein the driving IC is electrically coupled with the output power device through a wire therebetween; a power device electrode substrate; and a driving IC electrode substrate, which is independent from the power device electrode substrate. The output power device is mounted on the power device electrode substrate. The driving IC are mounted on the driving IC electrode substrate. The power device electrode substrate together with the output power device and the driving IC electrode substrate together with the driving IC are integrally sealed with a resin mold to be a package.

In the above device, since the wire between the output power device and the driving IC is short, the output power device is controlled with high speed. Further, an electric potential of the driving IC electrode substrate can be set to be different from an electric potential of the power device electrode substrate.

According to a third aspect of the present disclosure, a load driving device includes: a power device for driving a load; a control element for controlling the power device, wherein the control element is electrically coupled with the power device through a wire therebetween; a spacer element; first and second heat radiation plates; and a resin mold. The power device is sandwiched between the first and second heat radiation plates. The space element is disposed between the power device and the second heat radiation plate so that the wire does not contact the first and second heat radiation plates. The control element is sandwiched between the first and second heat radiation plates. The second heat radiation plate includes an opening. The control element faces the opening of the second heat radiation plate. The resin mold molds the first and second heat radiation plates, the power device, the spacer element and the control element.

In the above device, since the wire between the output power device and the driving IC is short, the output power device is controlled with high speed. Further, a mounting area of the output power device and the driving IC is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
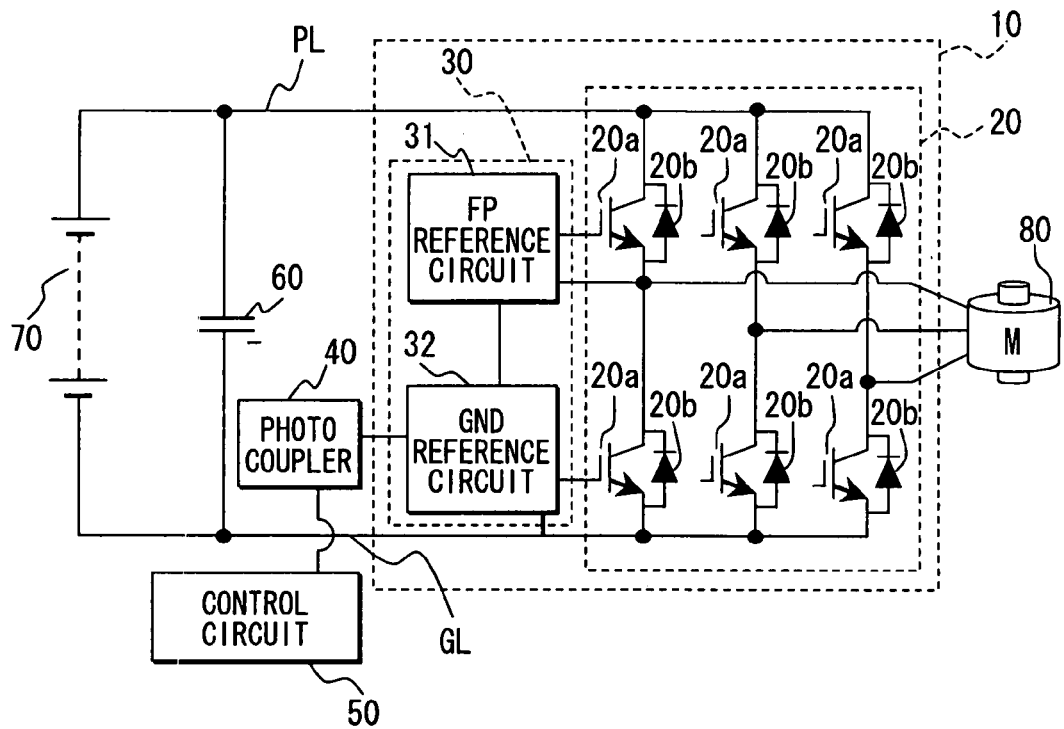
FIG. 1 is a circuit diagram showing an inverter system.
Figure 3:
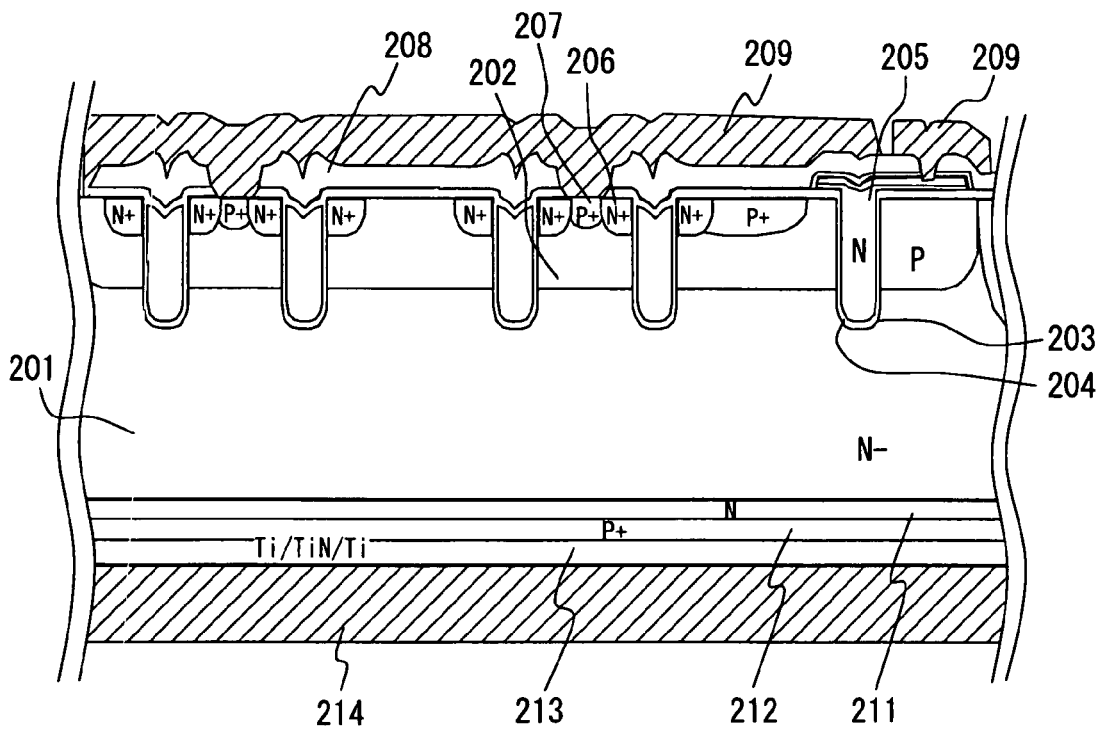
FIG. 3 is a partially enlarged cross sectional view showing a power device in the semiconductor module.
Figure 2A:
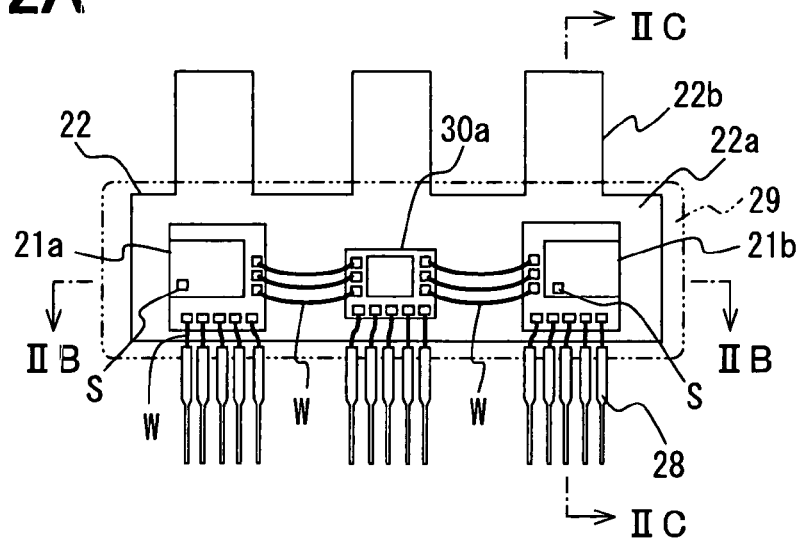
FIG. 2A is a plan view showing a semiconductor module according to a first embodiment.
Figure 2B:
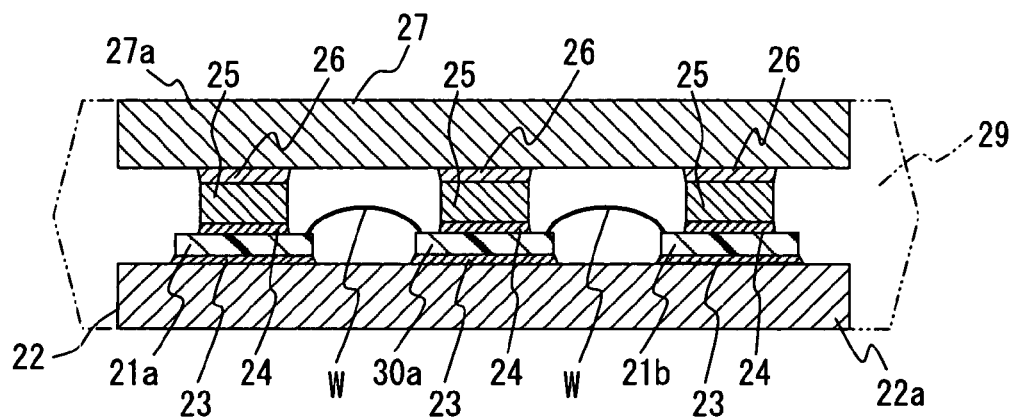
FIG. 2B is a cross sectional view showing the module taken along line IIB-IIB in FIG. 2A.
Figure 2C:
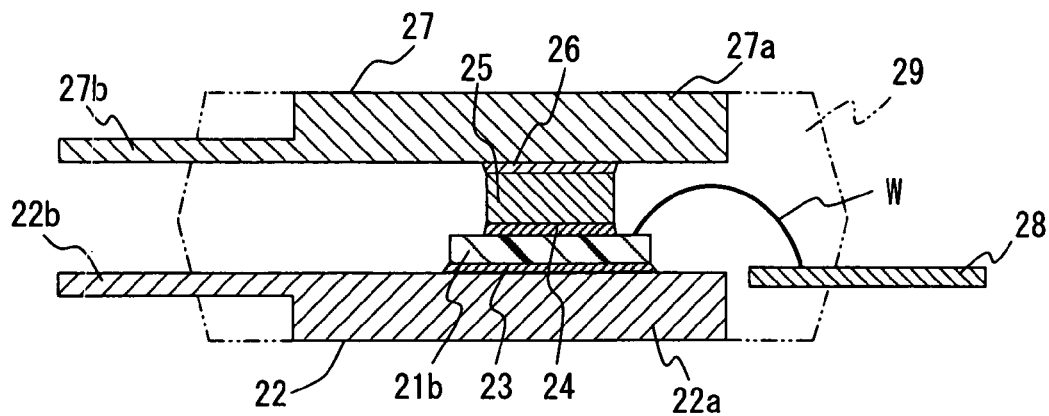
FIG. 2C is a cross sectional view showing the module taken along line IIC-IIC in FIG. 2A.
Figure 4A:
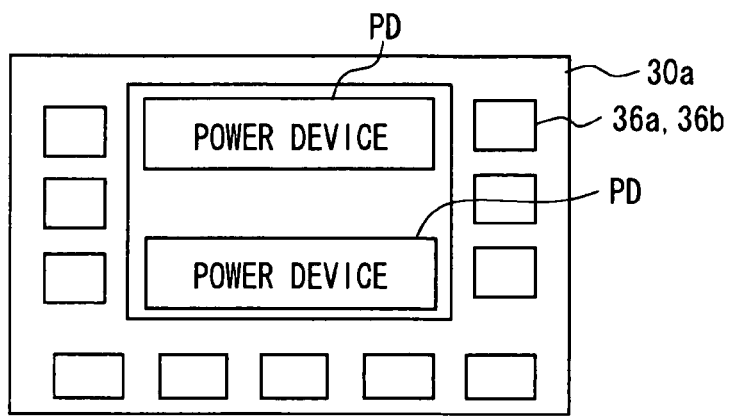
FIG. 4A is a plan view showing a HVIC in the module.
Figure 4B:
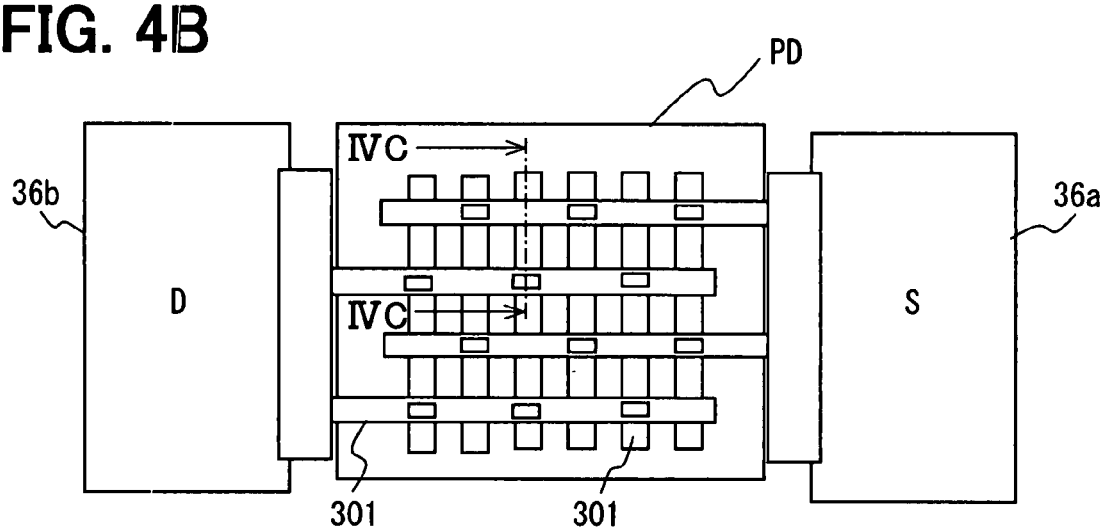
FIG. 4B is a perspective view showing the HVIC.
Figure 4C:
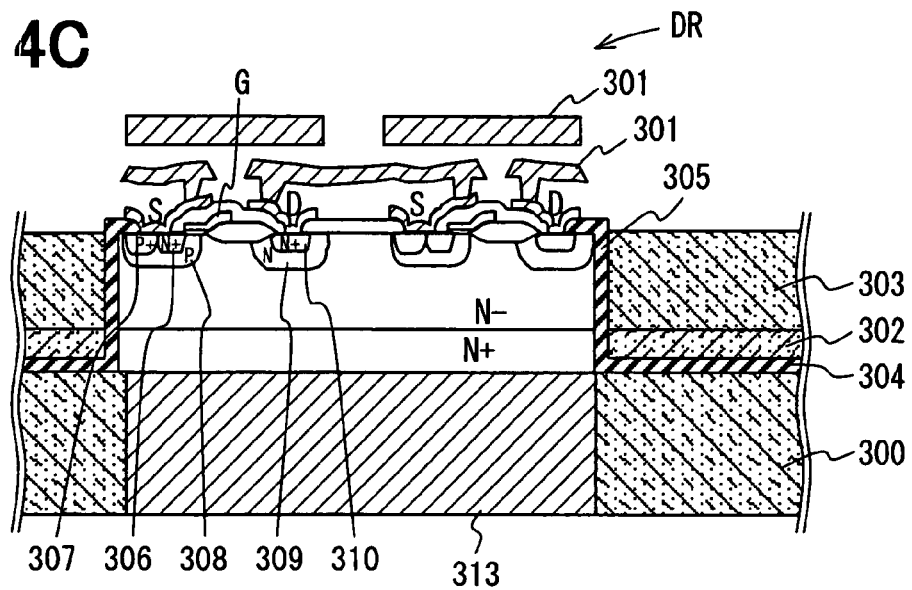
FIG. 4C is a cross sectional view showing the HVIC taken along line IVC-IVC in FIG. 4B.

A load driving device is suitably used for an inverter system of a EHV (i.e., electric and hybrid vehicle). FIG. 1 shows the inverter system, and FIGS. 2A-2C show a semiconductor module. FIG. 3 shows a power device such as an IGBT, and FIGS. 4A-4C show a HVIC (i.e., high voltage IC).

In FIG. 1, the inverter system includes the semiconductor module 10, a photo coupler 40, a control circuit 50, a capacitor 60, a main battery 70 and a motor 80. The semiconductor module 10 is an inverter having a power device portion 20 and a driving IC portion 30. Here, PL represents a power source line, and GL represents a ground line.

The main battery 70 is a direct current power source, and formed from a secondary battery such as a lithium-ion secondary battery and a nickel hydrogen battery. The main battery 70 supplies a direct current to the inverter such as the semiconductor module 10. The capacitor 60 is a smoothing capacitor, and connected between the power source line PL and the ground line GL so that the capacitor 60 reduces influence to the inverter caused by voltage fluctuation. The motor 80 is, for example, a three-phase alternating current motor, and receives the alternating current from the inverter so that the motor 80 generates rotational driving force.

A torque instruction value of the motor 80, a current value of each phase in the motor and an input voltage of the inverter are inputted into the control circuit 50 so that the control circuit 50 calculates a voltage of each phase coil in the motor 80. The control circuit 50 outputs calculation results through the photo coupler 40. The current value of each phase on the motor 80 is detected by a current sensor (not shown). The input voltage of the inverter is detected by a voltage sensor (not shown). Further, the torque instruction value and the motor rotation speed are inputted into the control circuit 50 so that the control circuit 50 calculates a target value, i.e., an optimum value, of the input voltage of the inverter. The control circuit 50 calculates a duty ratio of the output power device, i.e., the IGBT 20a on the basis of the target value of the input voltage, the input voltage of the inverter and the voltage of the main battery 70. The duty ratio of the IGBT 20a provides to coincide the input voltage of the inverter with the target value. The calculation results of the duty ratio are outputted from the control circuit 50 through the photo coupler 40. Here, the output of the calculation results is provided by a PWM signal.

In general, a main battery of an inverter system has a high voltage in a range between 100 volts and 400 volts. Specifically, regarding motor control for a vehicle such as an electric vehicle and a hybrid electric vehicle, a main battery has high voltage such as direct voltage of 650 V. Thus, to drive the IGBT 20a connecting to a high voltage side of the main battery 70, an electric potential of a gate electrode of the IGBT 20a is required to be higher than the high voltage of the main battery 70. Accordingly, signal transmission between the control circuit 50 and the semiconductor module 10 is performed through the photo coupler 40.

The semiconductor module 10 includes a power device portion 20 and a driving IC portion 30. The power device portion 20 includes the IGBT 20a as an output power device, and a diode 20b as a rectification element such as a free wheel diode. Two IGBTs 20a and a HVIC 30a provide a unit. The HVIC 30a corresponds to the two IGBTs 20a. The HVIC 30a is a driving IC. The unit provides a U-phase arm, a V-phase arm or a W-phase arm. Each arm is connected in parallel between the power source line PL and the ground line GL. A diode 20b is connected between a collector and an emitter of each IGBT 20a. The diode 20b flows the current from the emitter side to the collector side of the IGBT 20a. A connection point between the diode 20b and the IGBT 20a in each arm is connected to a phase terminal of the phase coil in the motor 80.

The driving IC portion 30 is formed from the HVIC 30a and the like. The driving IC 30 includes a floating potential reference gate driving circuit 31 and a ground reference gate driving circuit 32. The floating potential reference gate driving circuit 31 has a reference of the floating potential, which is higher potential. The ground reference gate driving circuit 32 has a reference of the ground potential, which is lower potential. The floating potential reference gate driving circuit 31 drives the IGBT 20a connecting to the high potential side of the main battery 70 on the basis of the signal outputted from the control circuit 50. The ground reference gate driving circuit 32 drives the IGBT 20a connecting to the low potential side of the main battery 70 on the basis of the signal outputted from the control circuit 50.

The driving IC portion 30 provides a detection means and a protection means. Specifically, the driving IC portion 30 detects malfunction based on the signal outputted from a sensor S such as a temperature sensor, an over current sensor, excess voltage sensor and a short-circuit sensor. The sensor S is mounted on power devices 21a, 21b. On the basis of the detection results, the driving IC portion 30 protects the IGBT 20a.

Next, the construction of the semiconductor module 10 is described. FIGS. 2A-2C show one of the arms in the inverter shown in FIG. 1. Here, the U-phase arm, the V-phase arm and the W-phase arm have the same construction shown in FIGS. 2A-2C.

The semiconductor module 10 includes the power devices 21a, 21b, the HVIC 30a, and a pair of electrode plates 22, 27 as a second electrode plate. Each power device 21a, 21b includes the IGBT 20a and the sensor S, which are mounted and packaged.

The IGBT 20a is a trench gate type FS IGBT (i.e., field stop insulated gate bipolar transistor), as shown in FIG. 3. The IGBT 20a includes a semiconductor substrate 201, which is made from a FZ (floating zone) wafer having a N conductive type and provides a drift layer. The substrate 201 has an impurity concentration of, for example, $1\times10^{14}$ cm$^{-3}$. A base region 202 is selectively formed in a surface portion on a first principal surface of the substrate 201. The base region 202 has a P conductive type and provides a first semiconductor region. The base region 202 is disposed in an IGBT forming region.

A trench 203 is selectively formed in the base region 202. The trench 203 penetrates the base region 202 from the first principal surface of the substrate 201. The bottom of the trench 203 reaches the semiconductor substrate 201. The trench 203 has the diameter of 1 μm and the depth of 5 μm. A gate insulation film 204 made of, for example, an oxide film is formed on the bottom and the sidewall of the trench 203. A gate electrode 205 is formed in the trench 203 through the gate insulation film 204. The gate electrode 205 is made of poly silicon having an impurity concentration of $1 \times 10^{20}$ cm$^{-3}$.

An emitter region 206 is selectively formed in the base region 202. The emitter region 206 is adjacent to the sidewall of the trench 203, i.e., the emitter region 206 is adjacent to the gate electrode 204 through the gate insulation film 204 therebetween. The emitter region 206 has the N$^+$ conductive type and provides a second semiconductor region in a surface portion of the first principal surface of the substrate 201. The emitter region 206 has a thickness of 0.5 μm and an impurity concentration of $1 \times 10^{19}$ cm$^3$. A contact region 207 is formed between two emitter regions 206. The contact region 207 has the P$^+$ conductive type. The contact region 207 is electrically connected to an emitter electrode 209. The emitter electrode 209 is made of aluminum or copper material, and formed on the substrate 201 through an interlayer insulation film 208 therebetween.

A field stop layer 211 having the N conductive type, a collector layer 212 having the P$^+$ conductive type, a connection layer 213 made of a Ti/TiN/Ti multilayered film and a collector electrode 214 are formed in a surface portion of a second principal surface of the substrate 201.

Preferably, the emitter electrode 209 and the collector electrode 214 are made of material having thermal expansion coefficient substantially equal to the electrode plates 22, 27 so that thermal stress caused by difference of thermal expansion coefficient between the IGBT 20a and the electrode 22, 27 is reduced. For example, when the electrode plates 22, 27 are made of copper, the emitter electrode 209 and the collector electrode 214 are made of copper series material.

The IGBT 20a together with the sensor S are mounted and packaged on the substrate 201. The sensor S detects malfunction of the power device 21a, 21b.

As shown in FIGS. 2B and 2C, each power device 21a, 21b are mounted on the electrode plate 22 with a connection member 23, which is made of conductive material such as solder. The power device 21a, 21b is electrically connected to and mounted on the electrode plate 22. The power device 21a, 21b is electrically connected to a spacer element 25 with a connection member 24 made of conductive material such as solder. Specifically, the spacer element 25 is disposed on one side of the power device 21a, 21b, the one side opposite to a mounting surface of the electrode plate 22. The spacer 25 is electrically connected to the second electrode plate 27 with the connection member 26 made of conductive material such as solder. Accordingly, the power device 21a, 21b are electrically connected to each other with the electrode plates 22, 27.

As shown in FIGS. 2B and 2C, the electrode plates 22, 27 are made of metal such as copper. Each electrode plate 22, 27 includes a heat radiation portion 22a, 27a and a terminal portion 22b, 27b. The power device 21a, 21b and the HVIC 30a are mounted on the heat radiation portion 22a, 27a. The terminal portion 22b, 27b protrudes from a resin mold 29. The electrode plate 22, 27 is used for an electrode of the power device 21a, 21b and the HVIC 30a, and further, for a heat radiation member for the power device 21a, 21b. Although two electrode plates 22, 27 are formed in the power device portion 20, only one electrode plate 22, 27 may be formed in the power device portion 20 in some cases where it is required for a semiconductor chip such as the power device 21a, 21b and the HVIC 30a mounted on the electrode plate 22, 27 to have at least one electrode plate 22, 27 as a heat radiation plate. Alternatively, the chip may be mounted on one electrode plate, and a heat radiation plate may be mounted on one side of the chip such that the heat radiation plate is not electrically connected to the chip, the one side opposite to a mounting surface of the electrode plate.

The HVIC 30a is mounted on and fixed to the electrode plate 22, on which the power devices 21a, 21b are mounted. Specifically, the HVIC 30a is mounted on the electrode plate 22 with the connection member 23 such as solder. The HVIC 30a is also connected to the spacer element 25 with the connection member 24 such as solder. Further, the spacer element 25 is connected to the electrode plate 27 with the connection member 26 such as solder.

The power devices 21a, 21b and the HVIC 30a are electrically connected to each other with a wire W. The power device 21a, 21b and the HVIC 30a are connected to the signal terminal 28 with the wire W. The power devices 21a, 21b, the HVIC 30a, and the electrode plates 22, 27 are integrally molded and sealed with the resin mold 29 so that they are packaged. At least one part of the electrode plate 22, which is opposite to the mounting surface of the power device 21a, and at least one part of the electrode plate 27, which is opposite to a connection surface of the power device 21a, are preferably exposed from the resin mold 29 so that heat radiation performance is improved.

The spacer element 25 electrically connects between the power devices 21a, 21b and the electrode plate 27. Further, the space element 25 maintains a distance between the electrode plates 22, 27 to prevent the wire W from contacting the electrode plate 27. The spacer element 25 radiates heat to the electrode plate 27, the heat generated in the power devices 21a, 21b and the HVIC 30a.

Thus, since the power devices 21a, 21b and the HVIC 30a are mounted on the same electrode plate 22, the mounting area is reduced. Further, the length of the wire W among the power devices 21a, 21b and the HVIC 30a, which is defined as a wiring distance, becomes shorter. Thus, the power devices 21a, 21b are controlled with high speed. Furthermore, the HVIC 30a is capable of detecting malfunction with high speed, and protection speed based on the malfunction detection result also quickens. Accordingly, the protection function is improved.

Figure 5:
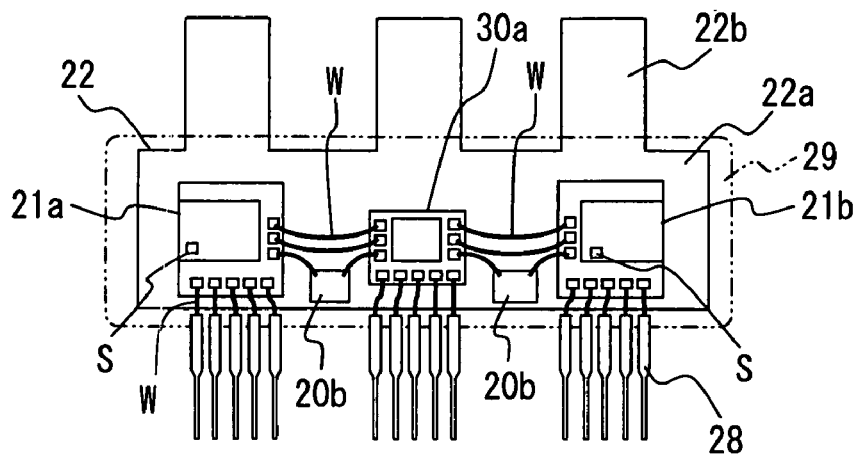
FIG. 5 is a perspective view showing a semiconductor module according to a modification of the first embodiment.

The diode 20b may be an independent body from the power device 21a, 21b and the HVIC 30a. The diode 20b may be mounted on the same electrode plate 22. Specifically, as shown in FIG. 5, the diode 20b such as a FWD (i.e., free wheel diode) may be mounted on the same electrode plate 22, on which the power devices 21a, 21b and the HVIC 30a are mounted. The diode 20b is electrically connected to the power devices 21a, 21b and the HVIC 30a with the wire W. Thus, the diode 20b, the power devices 21a, 21b and the HVIC 30a are mounted on the same electrode plate 22 so that the mounting area is reduced.

As shown in FIG. 4C, the HVIC 30a includes a high voltage LDMOS transistor formed in a SOI substrate.

As shown in FIG. 4A, multiple gate driving power devices PD such as high voltage LDMOS transistors and multiple pads 36a, 36b corresponding to a source S and a drain D of each power device are formed on a substrate 300. Each power device is electrically connected to the pad 36a, 36b with a wire 301 made of aluminum or copper. The wire 301 includes a first type wire 301 connecting to the source pad 36a and a second type wire 301 connecting to the drain pad 36b, which are arranged to be a lattice shape. Preferably, the wire 301 is made of material having a thermal expansion coefficient equal to the electrode plate 27 so that thermal stress caused by difference of thermal expansion coefficient between the HVIC 30a and the electrode plate 27 is reduced. For example, when the electrode plate 27 is made of copper, the wire is made of copper series material.

In the HVIC 30a formed of a SOI substrate, copper composing the electrode plate 27 may have a thermal expansion coefficient, which is different from that of silicon composing the SOI substrate. In general, a chip such as the HVIC 30a formed of a SOI substrate is sensitive to stress, so that the high voltage LDMOS transistor formed in the SOI substrate may be affected by the stress. Specifically, transistor characteristics of the LDMOS transistor may be affected by the stress. Thus, it is considered that the chip, i.e., the HVIC 30a, is thinned. For example, a thickness of the chip is in a range between 190 μm and 400 μm. Thus, the stress caused by difference of thermal expansion coefficient between the electrode plate 27 and the chip is reduced. However, when the chip is thinned, chip performance may be deteriorated by crystal defect and/or chip characteristics may be changed by stress. However, in the present embodiment, the wire 301 is made of the material having the thermal expansion coefficient substantially equal to the electrode plate 27 without thinning the chip; and therefore, the stress is reduced without deteriorating the chip performance.

Figure 6:
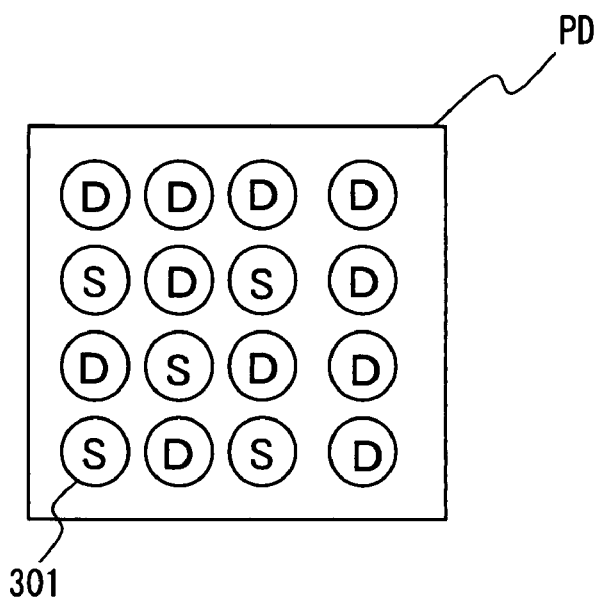
FIG. 6 is a plan view showing a HVIC according to the modification of the first embodiment.

Although the wire 301 has a lattice shape shown in FIG. 4B, the wire 301 may have a hounds-tooth shape shown in FIG. 6. In both cases, the local concentration of stress is reduced.

As shown in FIG. 4C, in the high voltage LDMOS transistor, an embedded oxide film 304 is formed on the substrate 300 as a support substrate made of silicon. A $N^+$ conductive type layer 302 and a $N^-$ conductive type layer 303 as a device layer are formed on the embedded oxide film 304. A groove is formed in the $N^+$ conductive type layer 302 and the $N^-$ conductive type layer 303. The groove has a ring shape and provides an insulation separation trench 305, which reaches the embedded oxide film 304. Thus, an island shaped device forming region DR surrounded with the embedded oxide film 304 and the insulation separation trench 305 is formed on the substrate 300. Multiple device forming regions RD having the same construction are also formed on the substrate 300. Each device forming region RD is electrically insulated with the embedded oxide film 304 and the insulation separation trench 305.

The high voltage LDMOS transistor is formed in the device forming region RD. Specifically, a P conductive type region 308 and a N conductive type region 309 are formed in a surface portion of the $N^-$ conductive type layer 303. The P conductive type region 308 is separated from the N conductive type region 309. A $P^+$ conductive type source region 307 and a $N^+$ conductive type source region 306 are formed in the P conductive type region 308. A $N^+$ conductive type drain region 310 is formed in the N conductive type region 309.

Further, a LOCOS oxide film is formed on the $N^-$ conductive type layer 303 between the P conductive type region 308 and the N conductive type region 309. A gate oxide film is arranged on a surface of the P conductive type region 308 between the LOCOS oxide film and the $N^+$ conductive type source region 306 and on a surface of the $N^-$ conductive type layer 303. A gate electrode G is formed on the gate oxide film. A source electrode S is formed on a surface of the $P^+$ conductive type source region 307 and on a surface of the $N^+$ conductive type source region 306. A drain electrode D is formed on a surface of the $N^+$ conductive type drain region 310. The gate electrode G, the source electrode S and the drain electrode D are electrically connected with the wire 301.

The substrate 300 includes an embedded layer 313 made of copper, which is disposed in a part of the substrate 300 corresponding to the device forming region DR. The embedded layer 313 is made of material having thermal expansion coefficient substantially equal to the electrode plate 22. By using the embedded layer 313, even when the electrode plate 22 is made of copper, the thermal stress caused by difference of thermal expansion coefficient between the HVIC 30a and the electrode plate 22 is reduced.

In general, when a semiconductor chip is formed of a SOI substrate, stress may be caused by difference of thermal expansion coefficient between copper providing the electrode plate 22 and silicon providing the SOI substrate. Further, a crack may be generated in the connection member 23 because of the difference of thermal expansion coefficient. Further, since the transistor characteristics of the chip are sensitive to the stress, i.e., much affected by the stress, the transistor characteristics; of the high voltage LDMOS transistor is affected by the stress easily. Thus, when the chip such as the HVIC 30a is thinned to be, for example, 190 μm to 400 μm, the stress caused by difference of thermal expansion coefficient between the electrode plate and the chip may be reduced. However, when the chip is thinned, chip performance may be deteriorated by crystal defect and/or chip characteristics may be changed by stress. However, in the present embodiment, the embedded layer 313 is formed in a part of the substrate 300, which corresponds to the device forming region DR, and the embedded layer 313 is made of material having thermal expansion coefficient substantially equal to the electrode plate 22. Thus, the stress is reduced without deteriorating the chip performance.

Second Embodiment

Figure 7A:
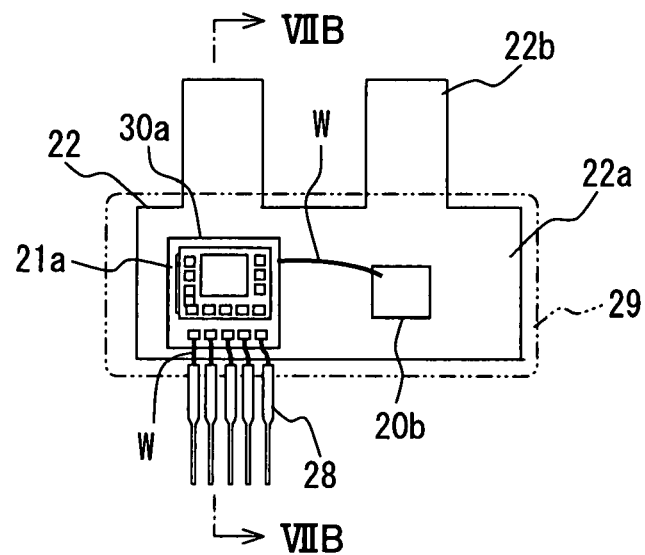
FIG. 7A is a perspective view showing a semiconductor module according to a second embodiment.
Figure 7B:
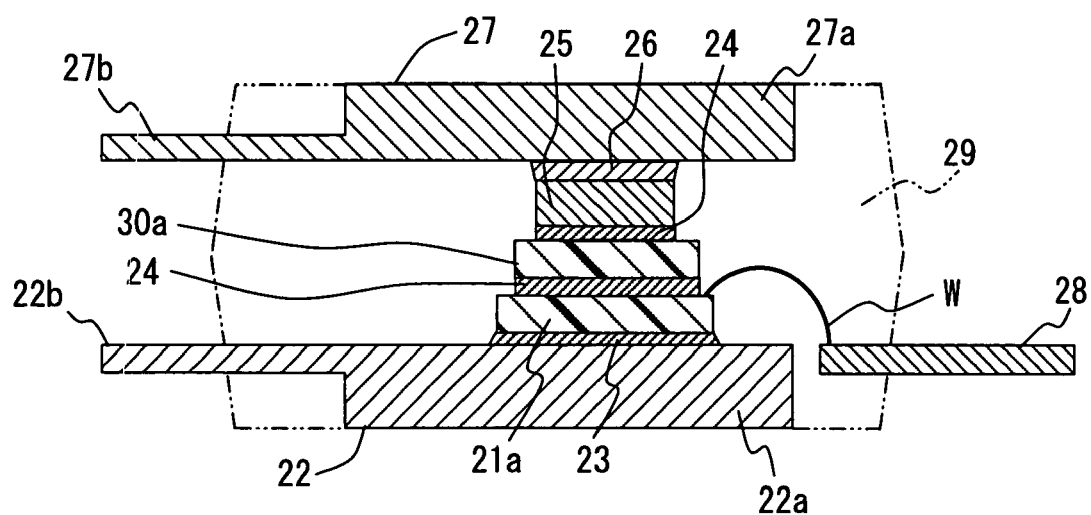
FIG. 7B is a cross sectional view showing the module taken along line VIIB-VIIB in FIG. 7A.
Figure 8:
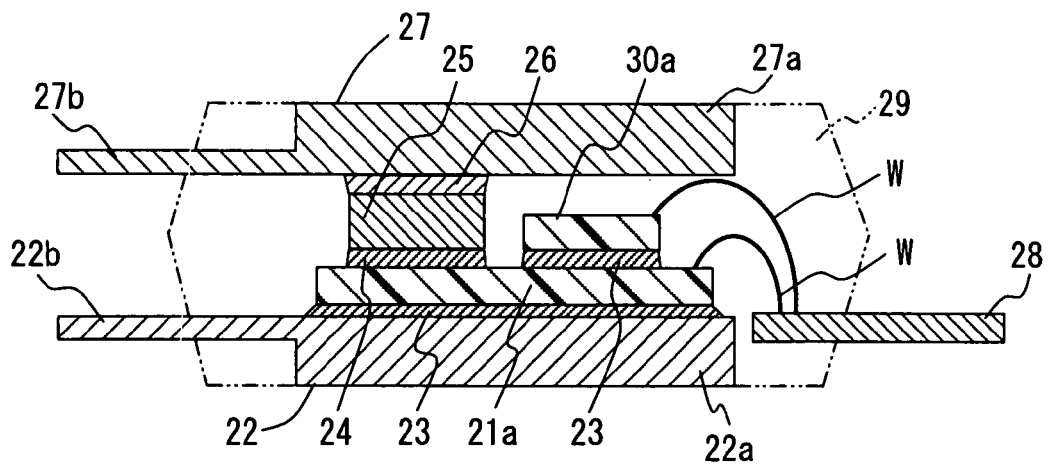
FIG. 8 is a cross sectional view showing a semiconductor module according to a modification of the second embodiment.

FIGS. 7A and 7B show a semiconductor module, and FIG. 8 shows another semiconductor module, according to a second embodiment.

The above semiconductor modules have difference from the module shown in FIG. 1, which is a mounting position of the HVIC 30a in the semiconductor module.

In FIG. 7A, the power devices 21a, 21b and the diode 20b are electrically connected to the electrode plate 22 with the wire W, and the power devices 21a, 21b and the diode 20b are mounted on the plate 22 with a connection member (not shown) made of conductive material such as solder so that they are electrically connected to the plate 22. As shown in FIG. 7B, the HVIC 30a is formed on the power device 21a with the connection member 24. Thus, the power device 21a and the HVIC 30a are electrically connected to each other. The spacer element 25 is electrically connected to and mounted on the HVIC 30a with the connection member 24. The spacer element 25 is electrically connected to the electrode plate 27 with the connection member 26.

The power devices 21a, 21b are electrically connected to the signal terminal 28 with the wire W. The power devices 21a, 21b, the HVIC 30a and the electrode plates 22, 27 are integrally molded and sealed with the resin mold 29 so that they are packaged.

Thus, the HVIC 30a is not directly mounted on the electrode plate 22, but the HVIC 30a is mounted on the electrode plate 22 through the power device 21a therebetween. The difference of thermal expansion coefficient between silicon providing the HVIC 30a and copper providing the electrode plate 22 is suppressed. Thus, the stress is limited to generate in the HVIC 30a, and the crack is limited to generate in the connection member 24.

When the HVIC 30a is mounted on the power device 21a, the spacer element 25 may be mounted on the power device 21a through the connection member 24 therebetween. Thus, the spacer element 25 is not mounted on the HVIC 30a but the power device 21a.

Third Embodiment

Figure 9A:
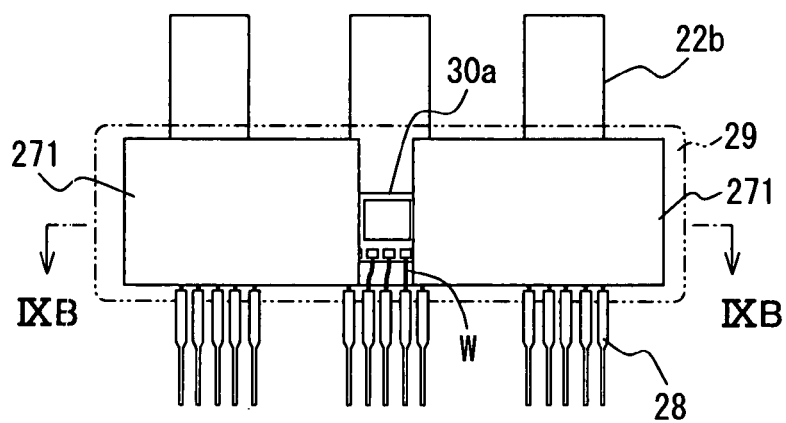
FIG. 9A is a perspective view showing a semiconductor module according to a third embodiment.
Figure 9B:
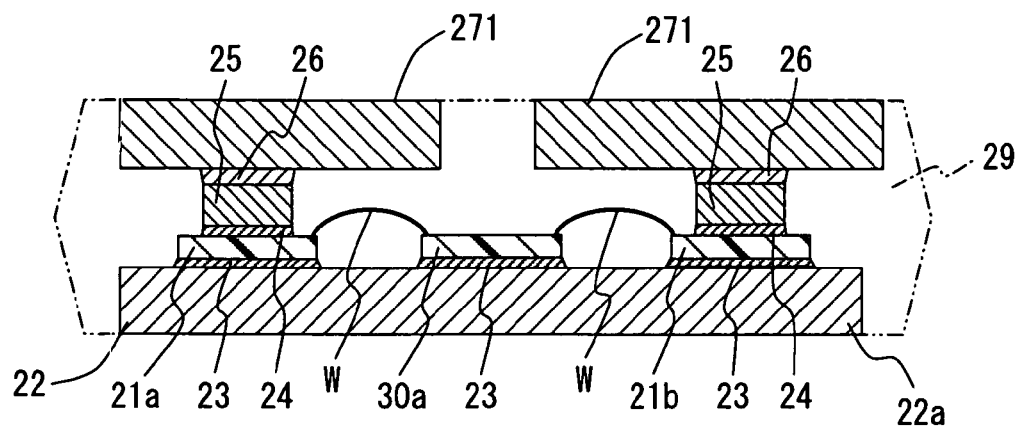
FIG. 9B is a cross sectional view showing the module taken along line IXB-IXB in FIG. 9A.
Figure 10:
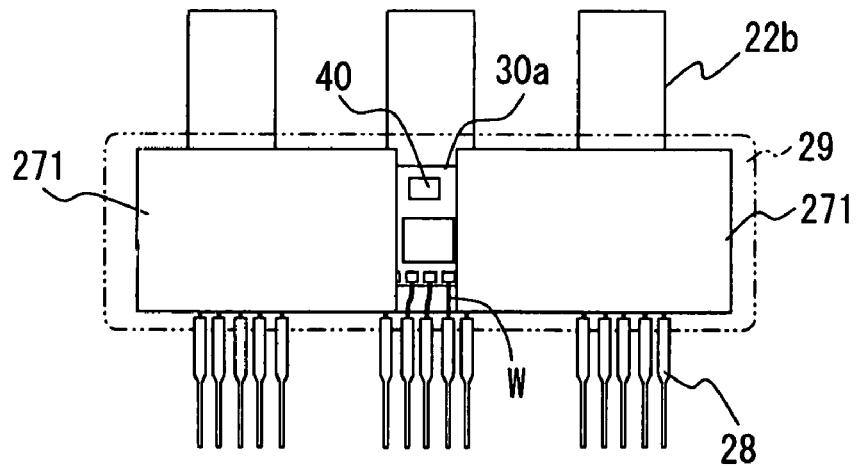
FIG. 10 is a perspective view showing a semiconductor module according to a modification of the third embodiment.
Figure 11:
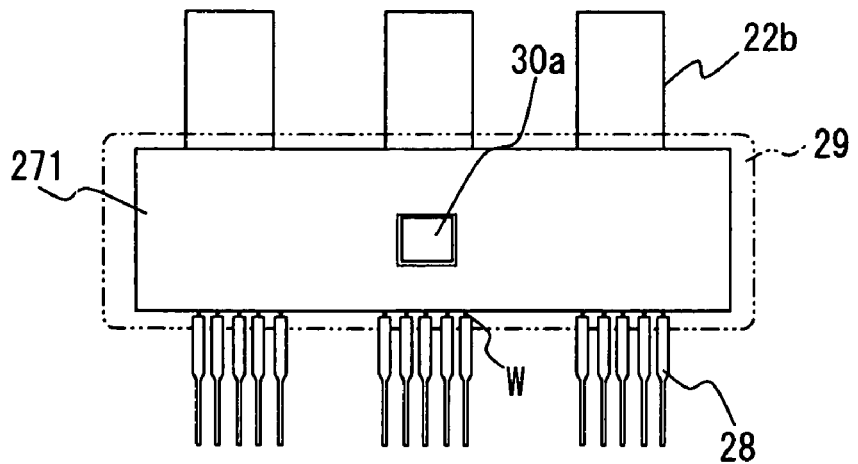
FIG. 11 is a perspective view showing a semiconductor module according to another modification of the third embodiment.

FIGS. 9A and 9B show a semiconductor module, FIG. 10 shows another semiconductor module, and FIG. 11 shows further another semiconductor module, according to a third embodiment.

The above semiconductor modules have difference from the module shown in FIG. 1, which is an electrode plate.

As shown in FIG. 9B, the power devices 21a, 21b and the HVIC 30a are mounted on the electrode plate 22 through the connection member 23, and electrically connected to the electrode plate 22 with the wire W. The power devices 21a, 21b are electrically connected to the spacer element 25 with the connection member 24. Specifically, the spacer element 25 is bonded to one side of the power devices 21a, 21b, the one side which is opposite to the electrode plate 22. Further, the spacer element 25 is connected to the heat radiation plate 271 with the connection member 26. The heat radiation plate 271 is made of, for example, copper, and has an opening corresponding to the HVIC 30a. Thus, in the semiconductor module shown in FIGS. 9A and 9B, the heat radiation plate 271 is not formed on a position corresponding to the HVIC 30a but on another position corresponding to the power devices 21a, 21b. This heat radiation plate 271 is a second electrode plate having heat radiation property. The heat radiation plate 271 is provided by dividing the electrode plate 27.

The power devices 21a, 21b and the HVIC 30a are electrically connected to the signal terminal 28 with the wire W. The power devices 21a, 21b, the HVIC 30a, the electrode plate 22 and the heat radiation plate 271 are molded with the resin mold 29 so that they are packaged.

The heat radiation plate 271 has the opening corresponding to the HVIC 30a, and the heat radiation plate 271 is formed at a position corresponding to the power devices 21a, 21b. Thus, the heat generated in the power devices 21a, 21b is radiated. Further, since the heat radiation plate 271 has the opening corresponding to the HVIC 30a, the difference of thermal expansion coefficient between silicon providing the HVIC 30a and copper providing the heat radiation plate 271 is suppressed. Thus, the stress is limited to generate in the HVIC 30a without thinning the HVIC 30a, and the crack is limited to generate in the connection member 23.

Further, since the heat radiation plate 271 has the opening corresponding to the HVIC 30a, in the semiconductor module 10, the photo coupler 40 may be formed on the HVIC 30a, as shown in FIG. 10. Thus, the signal is capable of transmitting with the photo coupler 40. Although the module 10 includes the photo coupler 40 for transmitting the signal, the module may have an electro-magnetic element or an electrostatic element.

Alternatively, the heat radiation plate 271 may have an opening only corresponding to the HVIC 30a, as shown in FIG. 11. Further, the heat radiation plate 271 may provide an electrode plate having heat radiation function.

Fourth Embodiment

Figure 12A:
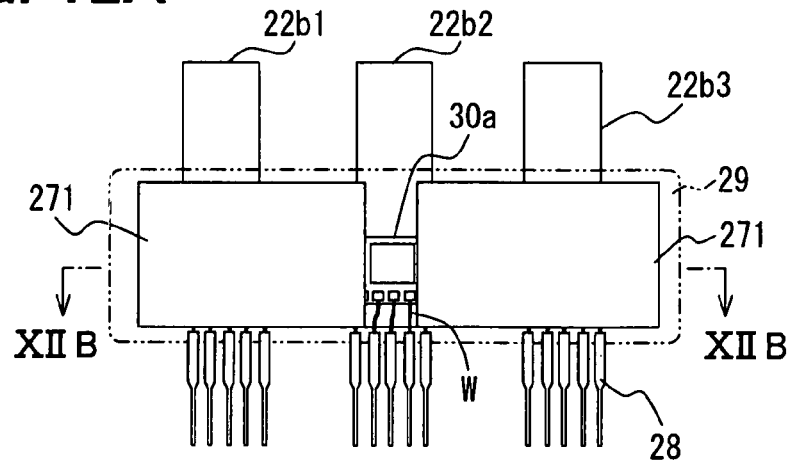
FIG. 12A is a perspective view showing a semiconductor module according to a fourth embodiment.
Figure 12B:
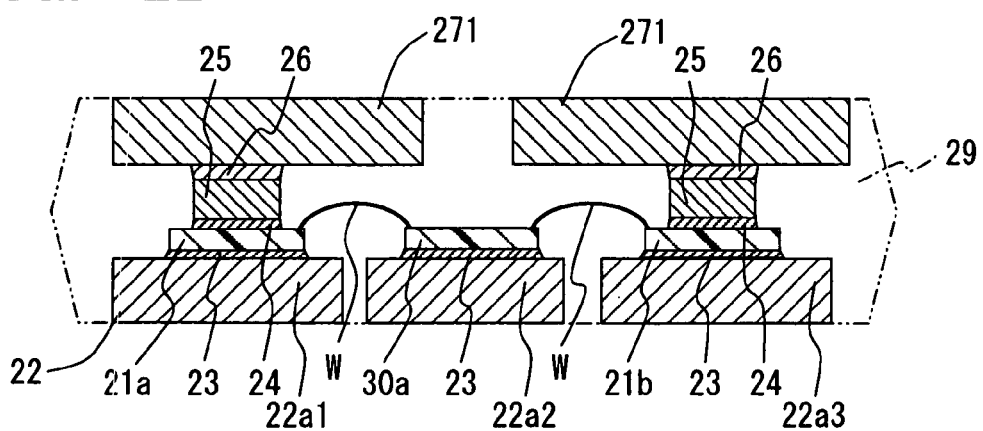
FIG. 12B is a cross sectional view showing the module taken along line XIIB-XIIB in FIG. 12A.
Figure 13:
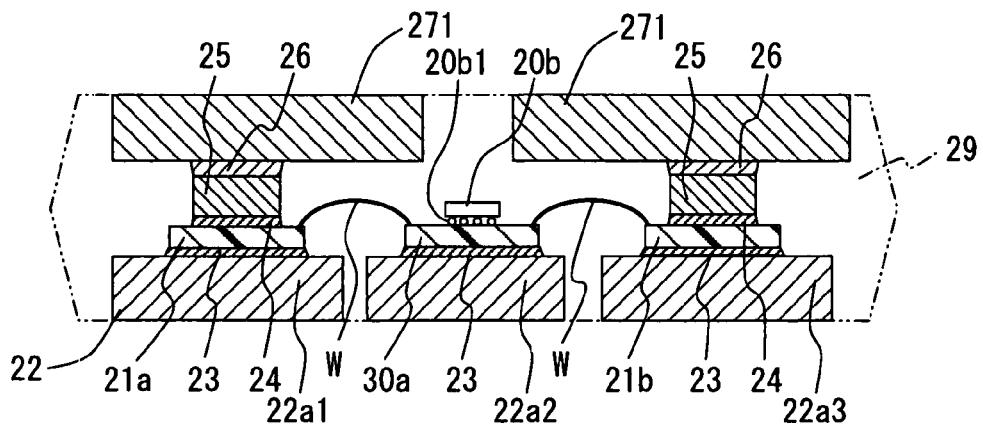
FIG. 13 is a cross sectional view showing a semiconductor module according to a modification of the fourth embodiment.

FIGS. 12A and 12B show a semiconductor module, and FIG. 13 shows another semiconductor module, according to a fourth embodiment.

The above semiconductor modules have difference from the module shown in FIG. 1, which is a shape of an electrode plate.

As shown in FIG. 12B, the electrode plate 22 is divided into multiple portions, which are a power device electrode plate portion 22a1, an IC electrode plate portion 22a2 and another power device electrode plate portion 22a3. The heat radiation plate 271 as the second electrode is also divided into multiple portions, which are a first heat radiation plate 271 corresponding to the power device 21a and a second heat radiation plate 271 corresponding to the power device 21b.

The power device 21a is electrically mounted on the power device electrode plate portion 22a1 with the connection member 23. Further, the power device 21a is electrically connected to the heat radiation plate 271 through the spacer element 25 and the connection members 24, 26. The power device 21a is mounted on one side of the heat radiation plate 271, the one side which is opposite to a mounting surface of the power device electrode plate portion 22a1. The HVIC 30a is electrically mounted on the IC electrode plate portion 22a2 with the connection member 23. The power device 21b is electrically mounted on the other power device electrode plate portion 22a3 with the connection member 23. Further, the power device 21b is electrically connected to the heat radiation plate 271 through the spacer element 25 and the connection members 24, 26. Specifically, the power device 21b is mounted on one side of the heat radiation plate 271, the one side which is opposite to a mounting surface of the other power device electrode plate portion 22a3. The power devices 21a, 21b and the HVIC 30a are electrically connected to each other with the wire W. The power devices 21a, 21b, the HVIC 30a, the power device electrode plate portion 22a1, the IC electrode plate portion 22a2, the other power device electrode plate portion 22a3, and the heat radiation plate 271 are molded with the resin mold 29 so that they are packaged. Thus, the power devices 21a, 21b and the HVIC 30a are separated from each other with the resin mold 29.

As shown in FIG. 12B, at least a part of the power device electrode plate portion 22a1, at least a part of the IC electrode plate portion 22a2, at least a part of the other power device electrode plate portion 22a3, and at least a part of the heat radiation plate 271 are preferably exposed from the resin mold 29 so that the heat radiation performance is improved. Specifically, the part of the power device electrode plate portion 22a1 is opposite to the mounting surface of the power device 21a, the part of the IC electrode plate portion 22a2 is opposite to the mounting surface of the HVIC 30a, and the part of the other power device electrode plate portion 22a3 is opposite to the mounting surface of the power device 21b. The part of the heat radiation plate 271 is opposite to a connection surface of the power devices 21a, 21b.

In this case, the length of the wire W connecting between the power devices 21a, 21b and the HVIC 30a becomes short. Thus, the power devices 21a, 21b are controlled with high speed.

Further, the electric potential of each of the power device electrode plate portion 22a1 and the other power device electrode plate portion 22a3 is set to be different from the electric potential of the IC electrode plate portion 22a2. Here, the power device 21a is mounted on the power device electrode plate portion 22a1, the power device 21b is mounted on the power device electrode plate portion 22a3, and the HVIC 30a is mounted on the IC electrode plate portion 22a2. Specifically, the plate potential of the IC electrode plate portion 22a2 is set to be floating potential, or to control independently from the plate potentials of the power device electrode plate portion 22a1 and the other power device electrode plate portion 22a3, so that the applied electric field to the embedded oxide film in the HVIC 30a is reduced when the HVIC 30a is formed from the SOI substrate. Thus, the embedded oxide film in the HVIC 30a is prevented from breakdown.

A FWD (not shown) may be disposed in a package, in which the power devices 21a, 21b and the HVIC 30a are packaged. The FWD, the power devices 21a, 21b and the HVIC 30 are electrically connected to each other with the wire W. In this case, the FWD is accommodated in the same package of the power devices 21a, 21b and the HVIC 30a, so that the mounting area is reduced. Further, when the FWD is incorporated in the package, the diode 20b is mounted on the HVIC 30a with the connection member 20b1, as shown ion FIG. 13. In this case, the dimensions of the package are much reduced.

In this embodiment, the power devices 21a, 21b mounted on the power device electrode plate portion 22a1 and the other power device electrode plate portion 22a3, respectively, and the HVIC 30a mounted on the IC electrode plate portion 22a2 are packaged with the resin mold 29. Alternatively, the power devices 21a, 21b mounted on the power device electrode plate portion 22a1 and the other power device electrode plate portion 22a3, respectively, the HVIC 30a mounted on the IC electrode plate portion 22a2 and the FWD 20b are packaged with the resin mold 29. Alternatively, at least one power device for driving the load and a driving IC for driving the power device may be independently mounted on different electrode plates, and they may be integrally sealed with a resin mold so that they are packaged. Here, the driving IC is electrically connected to the power device with a wire, and one of the electrode plates is a power device electrode plate for mounting the power device, and the other one of the electrode plates is an IC electrode plate for mounting the driving IC.

Fifth Embodiment

Figure 14A:
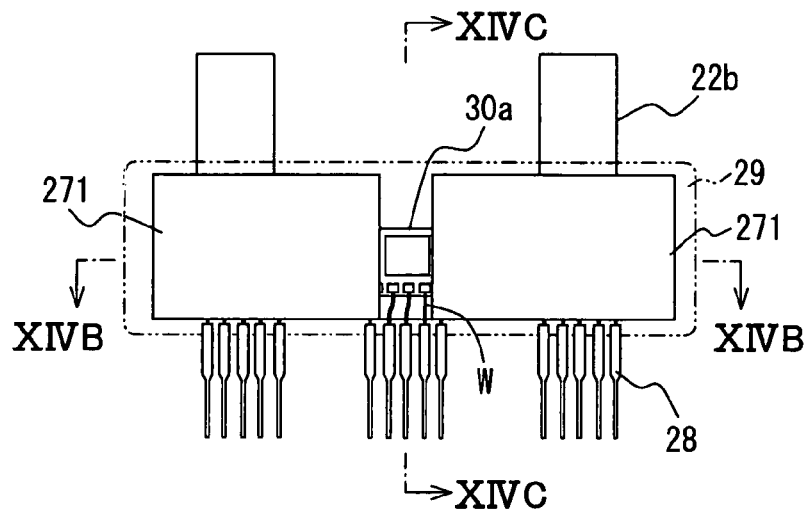
FIG. 14A is a perspective view showing a semiconductor module according to a fifth embodiment.
Figure 14B:
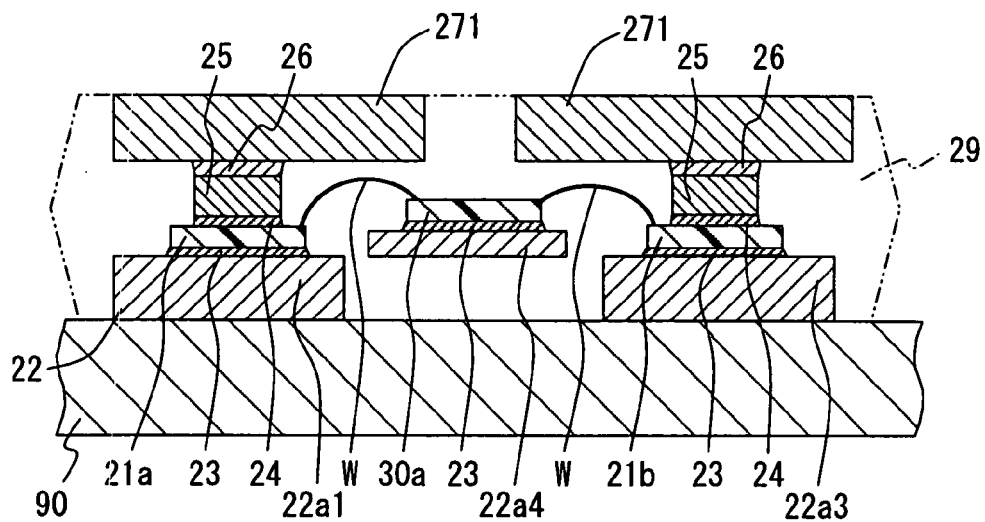
FIG. 14B is a cross sectional view showing the module taken along line XIVB-XIVB in FIG. 14A.
Figure 14C:
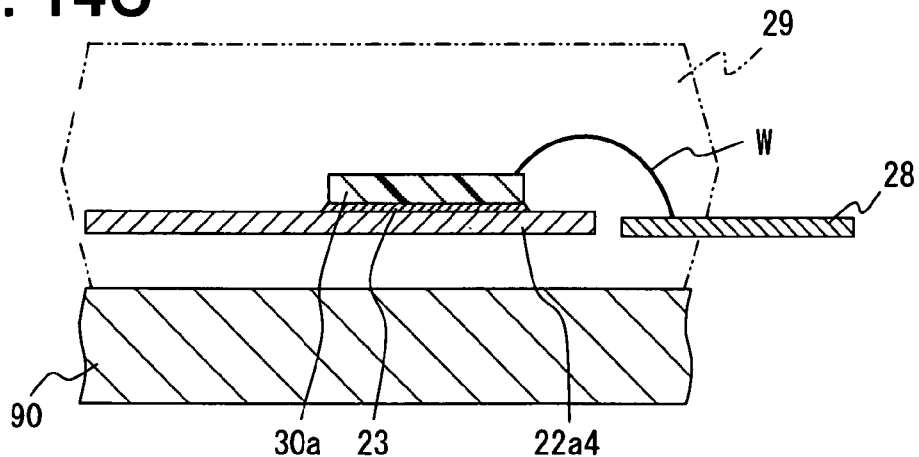
FIG. 14C is a cross sectional view showing the module taken along line XIVC-XIVC in FIG. 14A.

FIGS. 14A to 14C show a semiconductor module, according to a fifth embodiment.

The above semiconductor modules have difference from the module shown in FIG. 1, which is a position of an electrode plate and a heat radiation member.

As shown in FIGS. 14A to 14C, at least a part of the power device electrode plate portion 22a1, at least a part of the other power device electrode plate portion 22a3 and at least a part of the heat radiation plate 271 are exposed from the resin mold 29. Here, the part of the power device electrode plate portion 22a1 is opposite to the mounting surface of the power device 21a, and the part of the other power device electrode plate portion 22a3 is opposite to the mounting surface of the power device 21b. The part of the heat radiation plate 271 is opposite to a connection surface of the power devices 21a, 21b. Specifically, the electrode plate 22a4, on which the HVIC 30a is mounted, is disposed in the resin mold 29, and has an electrically floating state. A heat radiation member 90 is formed to contact the part of the power device electrode plate portion 22a1 and the part of the other power device electrode plate portion 22a3, which are exposed from the resin mold 29. The heat radiation member 90 has electric conductivity. Accordingly, the power device electrode plate portion 22a1 and the other power device electrode plate portion 22a3 have the same electric potential. The power devices, 21a, 21b and the HVIC 30a are separated from each other with the resin mold 29.

The electric potential of each of the power device electrode plate portion 22a1 and the other power device electrode plate portion 22a3, on which the power devices 21a, 21b are mounted, respectively, is independently controlled to be different from the electric potential of the electrode plate 22a4, on which the HVIC 30a is mounted. Further, heat radiation performance is improved.

Sixth Embodiment

Figure 15:
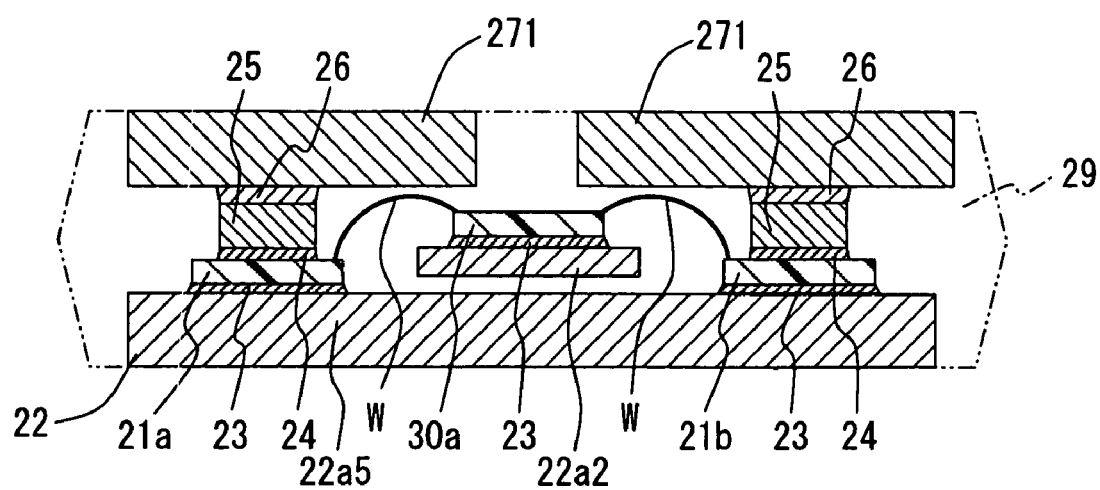
FIG. 15 is a cross sectional view showing a semiconductor module according to a sixth embodiment.

FIG. 15 shows a semiconductor module, according to a sixth embodiment.

The above semiconductor modules have difference from the module shown in FIG. 1, which is a shape of an electrode plate.

The power devices 21a, 21b are commonly mounted on an electrode plate 22a5 with the connection member 23 so that a ground terminal of a high potential side and a drain terminal of a low potential side conform to a common terminal. Here, the ground terminal of the high potential side is the ground terminal of the IGBT 20a to be operated by the floating potential reference gate driving circuit 31. The drain terminal of the low potential side is the drain terminal of the IGBT 20a to be operated by the ground reference gate driving circuit 32. The electrode plate 22a5 is independent from the IC electrode plate portion 22a2, on which the HVIC 30a is mounted. Each power device 21a, 21b is connected to the heat radiation plate 271 through the connection members 24, 26 and the spacer element 25. The power devices 21a, 21b and the HVIC 30a are separated from each other with the resin mold 29.

Thus, the electrode plate 22a5 provides both of the ground terminal of the power device 21a and the drain terminal of the power device 21b. One of the heat radiation plates 271 connecting to the power device 21a provides the drain terminal of the power device 21a. The other one of the heat radiation plates 271 connecting to the power device 21b provides the ground terminal of the power device 21b.

Thus, the electric potential of the electrode plate 22a5 for mounting the power devices 21a, 21b thereon is set to be different from the electric potential of the IC electrode plate portion 22a2 mounting the HVIC 30a thereon.

Although the power device 21a, 21b is the IGBT, the power device 21a, 21b may be a power MOS transistor, a thyristor or a bipolar transistor.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A load driving device comprising:
   an output power device for driving a load;
   a driving IC for controlling the output power device, wherein the driving IC is electrically coupled with the output power device through a wire or a connection member;
   a first electrode substrate; and a heat radiation plate having heat radiation property, wherein the output power device and the driving IC are mounted on the first electrode substrate, the heat radiation plate is disposed on a side of the output power device and on a side of the driving IC, and the side of the output power device and the side of the driving IC are opposite to the first electrode substrate.

2. The device according to claim 1, further comprising a rectification element connecting to the output power device, wherein the rectification element is mounted on the first electrode substrate.

3. The device according to claim 1, wherein the driving IC includes a detection element for detecting malfunction of the output power device and a protection element for protecting the output power device based on a detection result of the detection element.

4. The device according to claim 1, wherein the first electrode substrate has heat radiation property.

5. The device according to claim 1, wherein the driving IC includes a support layer, an interlayer insulation film and a device layer, which provide a SOI structure, the support layer, the interlayer insulation film and the device layer are stacked in this order, the support layer couples with the first electrode substrate through a connection member therebetween, the device layer is made of silicon, the device layer includes a device forming region, the support layer includes a portion corresponding to the device forming region, and the portion of the support layer has a thermal expansion coefficient, which is substantially equal to a thermal expansion coefficient of the first electrode substrate.

6. The device according to claim 1, wherein the driving IC includes a wire, which faces the heat radiation plate, and the wire has a thermal expansion coefficient, which is substantially equal to a thermal expansion coefficient of the heat radiation plate.

7. The device according to claim 1, wherein the driving IC is mounted on the first electrode substrate through the output power device therebetween.

8. The device according to claim 1, wherein the heat radiation plate includes an opening, which corresponds to the driving IC.

9. The device according to claim 1, wherein the heat radiation plate is electrically coupled with the output power device so that the heat radiation plate provides a second electrode substrate of the output power device.

* * * * *